US006573743B2

(12) United States Patent
Sato

(10) Patent No.: US 6,573,743 B2
(45) Date of Patent: Jun. 3, 2003

(54) TESTING APPARATUS FOR TEST PIECE, TESTING METHOD, CONTACTOR AND METHOD OF MANUFACTURING THE SAME

(75) Inventor: Takashi Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/106,349

(22) Filed: Mar. 27, 2002

(65) Prior Publication Data

US 2002/0097064 A1 Jul. 25, 2002

Related U.S. Application Data

(62) Division of application No. 09/393,167, filed on Sep. 10, 1999, now Pat. No. 6,380,755.

(30) Foreign Application Priority Data

Sep. 14, 1998 (JP) ............................................ 10-279372
Nov. 7, 1998 (JP) ............................................ 10-331944

(51) Int. Cl.[7] ................................................ G01R 31/26
(52) U.S. Cl. ........................ 324/765; 324/754; 324/759
(58) Field of Search ................................ 324/754, 755, 324/759, 760, 761, 765; 439/482, 842

(56) References Cited

U.S. PATENT DOCUMENTS

| 5,070,297 A | * | 12/1991 | Kwon et al. | ................ 324/754 |
| 5,378,971 A | * | 1/1995 | Yamashita | ................. 324/72.5 |
| 5,600,259 A | * | 2/1997 | Bartyzel et al. | ............ 324/758 |
| 5,734,270 A | * | 3/1998 | Buchanan | ..................... 324/75 |
| 5,793,117 A | * | 8/1998 | Shimada et al. | .............. 257/48 |
| 6,380,755 B1 | * | 4/2002 | Sato | ............................ 324/754 |

OTHER PUBLICATIONS

Patent Abstracts of Japan, JP 7–231019 A, Aug. 29, 1995.
Patent Abstracts of Japan, JP 8–5666 A, Jan. 12, 1996.
Patent Abstracts of Japan, JP 8–340030 A, Dec. 24, 1996.
Patent Abstracts of Japan, JP 5–198636 A, Aug. 6, 1993.
Patent Abstracts of Japan, JP 5–218156 A, Aug. 27, 1993.
Patent Abstracts of Japan, JP 10–38918 A, Feb. 13. 1998.

* cited by examiner

*Primary Examiner*—Kamand Cuneo
*Assistant Examiner*—Minh N. Tang
(74) *Attorney, Agent, or Firm*—Oblon, Spivak, McClelland, Maier & Neustadt, P.C.

(57) ABSTRACT

An apparatus of the present invention for testing a test piece comprises a contactor including a clock circuit capable of varying the frequency and a pattern signal generating circuit for generating a test pattern signal in conformity with the frequency of the clock circuit. It is possible for the contactor to further include a comparator circuit. These circuits are controlled by a control signal supplied from a tester. The contactor of the present invention also includes a via hole formed in a surface region of the contactor substrate for receiving the probe terminal, a conductive layer covering the inner circumferential surface of the via hole, and a wiring pattern electrically connected to the conductive layer.

2 Claims, 4 Drawing Sheets

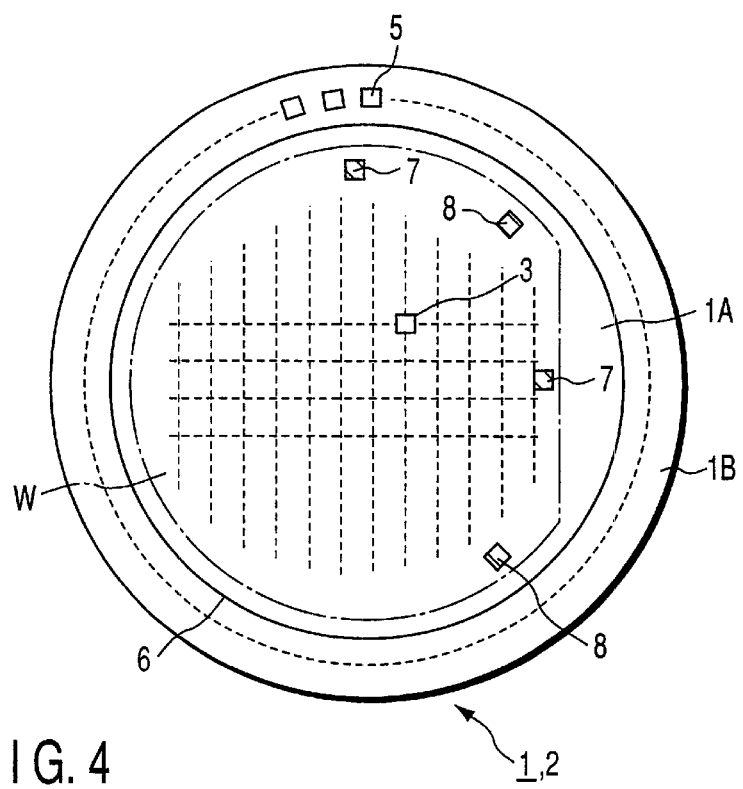
F I G. 4
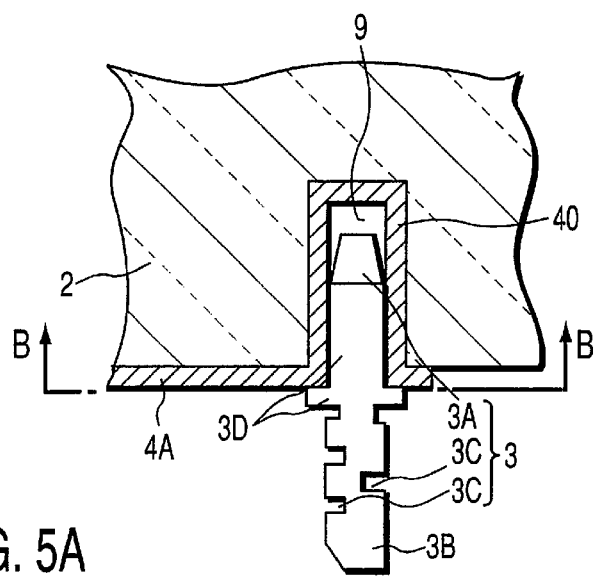
F I G. 5A
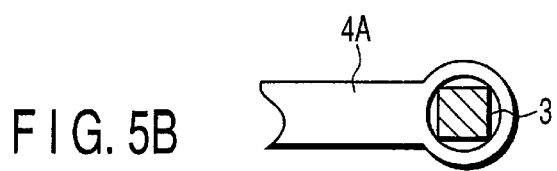
F I G. 5B

TESTING APPARATUS FOR TEST PIECE, TESTING METHOD, CONTACTOR AND METHOD OF MANUFACTURING THE SAME

CROSS REFERENCE TO RELATED APPLICATION

This application is a divisional of patent application Ser. No. 09/393,167, entitled "TESTING APPARATUS FOR TEST PIECE, TESTING METHOD, CONTACTOR AND METHOD OF MANUFACTURING THE SAME" filed in the U.S. Patent and Trademark Office on Sep. 10, 1999 now U.S. Pat. No. 6,380,755 and claims priority to the Japanese Application nos. 10-279372, filed on Sep. 14, 1998 and 10-331944, filed on Nov. 7, 1998, the entire contents of which being incorporated herein by reference.

BACKGROUND OF THE INVENTION

The present invention relates to a testing apparatus and a method for performing an electrical characteristic test for a test piece, particularly, to a testing apparatus and a method for performing an electrical characteristic test, e.g., a reliability test such as a burn-in test, for an electronic part having a large number of electronic circuits formed on the surface. To be more specific, the present invention relates to a wafer collective testing apparatus and a method for applying a reliability test such as a burn-in test, which is applied to a plurality of semiconductor devices, i.e., an IC chip, to an IC chip as formed on a semiconductor wafer. The present invention also relates to a contactor used for testing the electrical characteristics of a test piece and a method of manufacturing the same, more particularly, to a contactor that is collectively brought into contact with the test piece in performing the test and a method of manufacturing the same.

The electrical characteristics of each of a large number of IC chips formed on the surface of a wafer are tested in a process of testing a semiconductor device. IC chips free from defects are screened on the basis of the test results. The screened good IC chips are packaged with a synthetic resin or a ceramic material in the assembling process. In a burn-in test that is one of reliability tests, thermal and electrical stresses are applied to the packaged IC chip to make the latent defects of the IC chip visible.

With progress in miniaturization and required performance of various electrical appliances, the IC chip is also miniaturized and the degree of integration of the IC chip is promoted. Also, with progress in the operating speed of the electrical appliances, high frequency characteristics of 100 MHz to 300 MHz are required in the logic circuit or the memory circuit.

Recently, various mounting techniques have been developed for further miniaturization of the semiconductor device. Particularly, a technique in which an IC chip is not packaged, e.g., a flip chip mounting technique in which a so-called bare chip is mounted to an electrical appliance, is being developed. As a result of development of the particular technique, a quality-guaranteed KGD has come to be put on the market. In this case, the quality as KGD must be guaranteed by applying a burn-in test (reliability test) as a final test to each IC chip.

A technique for testing the reliability of an IC chip as formed on a wafer is proposed in, for example, Japanese Patent Disclosure (Kokai) No. 7-231019, Japanese Patent Disclosure No. 8-5666 and Japanese Patent Disclosure No. 8-340030. Particularly, the former two prior arts propose a technique for collectively bringing a wafer into contact with a contactor without fail while eliminating the thermal effect in performing a reliability test. In testing the reliability of the IC chip as formed on a wafer surface, it is very important to bring collectively the wafer into contact with a contactor at a high accuracy under high temperatures in order to ensure reliability of the burn-in test.

A probe card is used as a contactor in testing the electrical characteristics of an IC chip having a large number of memory circuits, logic circuits, etc. formed on a wafer. The probe card includes a plurality of probe terminals arranged to correspond to, for example, the positions of a plurality of electrode pads formed on the IC chip. During the test, the probe terminals of the probe card are electrically brought into contact with the electrode pads to play the role of relaying the testing signal and information on the result of the test between a tester and the IC chip. The probe terminal is formed of, for example, a tungsten wire or a pogo pin.

Recently, the number of electrode pads is rapidly increased with improvement in the degree of integration of IC chips. As a result, the pitch of arranging the electrode pads becomes narrower and narrower. Naturally, the number of probe terminals of the probe card is also increased rapidly, with the result that the probe terminals are arranged at a smaller pitch.

However, in a conventional wafer collective testing apparatus used for the reliability test, a long electrical connecting wire is used for connecting a pattern signal generating circuit mounted to the tester to the contactor. However, the pattern signal for the testing generated from the pattern signal generating circuit is electrically affected while transmitted through the long connecting wire, making it very difficult to test the reliability of the high speed IC chip under the actual operating speed. Therefore, in the conventional reliability test, it was necessary to test the reliability at an operating speed, e.g., about 1 to 10 MHz, at which the electrical influence is not given by the connecting wire.

Concerning the contactor, a plurality of probe terminals are manually mounted to a substrate. It should be noted in this connection that the number of probe terminals is increased nowadays as described previously, making it difficult to align manually the positions for mounting very small probe terminals at a small pitch and to mount manually the probe terminals. It follows that it is difficult to manufacture the contactor itself. In addition, the probe terminal made of a tungsten wire involves a limitation in the mounting structure, making it difficult to arrange the probe terminals to correspond flexibly to the arrangement of the testing electrode pads for the test piece. Incidentally, a technique relating to a contactor having probe terminals arranged at a small pitch is disclosed in, for example, Japanese Patent Disclosure No. 5-198636, Japanese Patent Disclosure No. 5-218156 or Japanese Patent Disclosure No. 10-38918.

BRIEF SUMMARY OF THE INVENTION

An object of the present invention is to solve the above-noted problems inherent in the conventional technique.

To be more specific, the present invention is intended to provide a collective testing apparatus for a test piece and a testing method, which permit conducting a test for electrical characteristics, i.e., a reliability test, of a test piece under an actual operating speed without receiving electrical influences given by the connecting wiring between a tester and a contactor even if the test piece operates at a high speed.

The present invention is also intended to provide a contactor, which can be made to correspond flexibly to the arrangement of the testing electrode pads of a test piece, which permits automatically mounting the probe terminals, and which also permits the probe terminals to be brought into contact satisfactorily with the electrode pads of the test piece so as to improve the accuracy of the test, and to provide a method of manufacturing the contactor.

According to a first aspect of the present invention, there is provided a testing apparatus for testing the electric characteristics of a plurality of circuit elements formed on a test piece, comprising:

a chuck for supporting a test piece having a plurality of test electrodes formed on the surface;

a tester for generating a control signal relating to an electrical characteristic test of a plurality of circuit elements formed on the test piece and for testing the electrical characteristics of the circuit elements based on the test result information generated from the circuit elements; and a contactor including a plurality of probe terminals that are collectively brought into contact with at least some of the test electrodes, a test pattern signal generating circuit for generating a test pattern signal in accordance with the control signal transmitted from the tester, a first electric connection wiring arranged between the test pattern signal generating circuit and the probes for transmitting the test pattern signal generated from the test pattern signal generating circuit to the probes, and second electric connection wirings for outputting the test result information generated from the circuit elements to the tester via the probe terminals.

In the testing apparatus of this embodiment, it is desirable for the test piece to consist of a plurality of IC chips formed on a semiconductor wafer.

It is also desirable for the testing apparatus to comprise further a pushing mechanism for pushing the contactor toward the test piece held on the chuck to bring the contactor into contact with the chuck.

It is also desirable for the contactor of the testing apparatus to further includes a contactor substrate on which the probe terminals are mounted and a holder for holding the contactor substrate.

It is also desirable for the contactor of the testing apparatus to further includes a clock circuit for generating a clock signal whose frequency can be varied, and for the test pattern signal generating circuit to generate a test pattern signal in accordance with the clock signal generated from the clock circuit.

It is also desirable for the contactor of the testing apparatus to further include a comparator circuit for comparing the test result information generated from the circuit elements with an expected value pattern signal to determine whether the electrical characteristics of the circuit element are good or not.

It is also desirable for the contactor of the testing apparatus to further include a register for temporarily storing the test result information generated from the circuit elements, and a comparator circuit for comparing the test result information supplied from the register with an expected value pattern signal so as to determine whether the electrical characteristics of the circuit element are good or not.

It is also desirable for the chuck and the contactor to be arranged within a test piece housing body for housing the test piece.

According to a second aspect of the present invention, there is provided a testing apparatus for testing the electrical characteristics of a plurality of circuit elements formed on a test piece, comprising:

a chuck for supporting a test piece having a plurality of test electrodes formed on the surface;

a tester for generating a control signal relating to an electrical characteristic test of a plurality of circuit elements formed on the test piece and for testing the electrical characteristics of the circuit elements based on the test result information generated from the circuit elements;

a contactor including a plurality of probe terminals that are collectively brought into contact with at least some of the test electrodes; and an electrical connection body for electrically connecting the contactor and the tester, the electrical connection body including a test pattern signal generating circuit for generating a test pattern signal in accordance with the control signal supplied from the tester.

In the testing apparatus of this embodiment, it is desirable for the test piece to consist of a plurality of IC chips formed on a semiconductor wafer.

It is also desirable for the contactor of the testing apparatus to include a contactor substrate having the probe terminals mounted thereto and a holder for holding the contactor substrate.

In the testing apparatus of this embodiment, it is also desirable for the electrical connector to be arranged to surround the outer circumferential surface of the chuck.

In the testing apparatus of this embodiment, it is also desirable for the electrical connector to be arranged separately from the chuck and the contactor.

In the testing apparatus of this embodiment, it is also desirable for the electrical connector to further include a clock circuit for generating a clock signal whose frequency can be varied, and for the test pattern signal generating circuit to generate a test pattern signal in accordance with the clock signal generated from the clock circuit.

In the testing apparatus of this embodiment, it is also desirable for the electrical connector to further include a comparator circuit for comparing the test result information generated from the circuit elements with an expected value pattern signal to determine whether the electrical characteristics of the circuit element are good or not.

In the testing apparatus of this embodiment, it is also desirable for the electrical connector to further include a register for temporarily storing the test result information generated from the circuit elements, and a comparator circuit for comparing the test result information supplied from the register with an expected value pattern signal so as to determine whether the electric characteristics of the circuit elements are good or not.

In the testing apparatus of this embodiment, it is also desirable for the chuck and the contactor to be arranged within a test piece housing body for housing the test piece.

According to a third aspect of the present invention, there is provided a method of testing electrical characteristics of a test piece, comprising the steps of:

collectively bringing the probe terminals of a contactor into contact with at least some of a plurality of test electrodes of a test piece disposed on a chuck;

allowing a control signal relating to an electrical characteristic test of the test piece to be generated from a tester and transmitting the control signal to a test pattern signal generating circuit mounted to the contactor;

allowing a test pattern signal to be generated from the test pattern signal generating circuit in accordance with the control signal supplied from the tester;

applying the test pattern signal to the test piece through the probe terminal;

outputting the test result information generated from the test piece to the tester through the probe terminal; and testing the electrical characteristics of the test piece in the tester based on the test result information.

In the method of the present invention, it is desirable for the test piece to consist of a plurality of IC chips formed on a semiconductor wafer.

According to a fourth aspect of the present invention, there is provided a method of testing electrical characteristics of a test piece, comprising the steps of:

collectively bringing the probe terminals of a contactor into contact with at least some of a plurality of test electrodes of the test piece disposed on a chuck;

allowing a control signal relating to the electrical characteristic test of the test piece to be generated from a tester, and transmitting the control signal to a test pattern signal generating circuit mounted to an electric connector for electrically connecting the contactor and the tester;

allowing a test pattern signal to be generated from the test pattern signal generating circuit in accordance with the control signal generated from the tester;

applying the test pattern signal to the test piece through the probe terminal;

outputting the test result information generated from the test piece to the tester through the probe terminal; and testing the electrical characteristics of the test piece in the tester based on the test result information.

According to a fifth aspect of the present invention, there is provided a contactor, comprising:

a contactor substrate including a plurality of terminal holes, a conductive layer formed on the inner circumferential surface of each terminal hole, and a wiring layer electrically connected to the conductive layer;

a probe terminal having the proximal end portion inserted into a predetermined one of the terminal holes and electrically connected to the conductive layer; and a holder for holding the contactor substrate.

In the contactor of the present invention, it is desirable for grooves extending in at least two opposite directions to be formed alternately on the side surface of a distal end portion, which is exposed to the outside of the terminal hole, of the probe terminal.

In the contactor of the present invention, it is also desirable for the proximal end portion of the probe terminal inserted into the terminal hole to be in the shape of a trapezium that is tapered upwardly.

In the contactor of the present invention, it is also desirable for the contactor substrate to further include a test pattern signal generating circuit for generating a test pattern signal in accordance with a control signal supplied from a tester.

In the contactor of the present invention, it is also desirable for the contactor substrate to include at least one temperature sensor mounted to that surface on which the probe terminal is mounted.

In the contactor of the present invention, it is also desirable for the contactor substrate to include a heat transmitting medium mounted to that surface on which the probe terminal is mounted.

According to a sixth aspect of the present invention, there is provided a method of manufacturing a contactor, comprising the steps of:

forming a plurality of terminal holes on a surface of a contactor substrate;

forming a conductive layer on the inner circumferential surface of each of the terminal holes, and forming a wiring layer electrically connected to the conductive layer; and inserting a probe terminal into a predetermined one of the terminal holes.

In the method of the present invention, it is desirable for the step of inserting the probe terminal into the terminal hole to include the process of successively detaching a predetermined number of probe terminals from a probe terminal member having a plurality of probe terminals joined to each other and pushing the detached probe terminal into the terminal hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a plan view schematically showing the relationship between the contactor and the test piece shown in FIG. 3;

FIG. 5A is a cross sectional view showing in a magnified fashion how the probe terminal of the contactor shown in FIG. 1 is mounted;

FIG. 5B is a cross sectional along the line B—B shown in FIG. 5A;

DETAILED DESCRIPTION OF THE INVENTION

The present invention, which is directed to a testing apparatus for testing the reliability of various test pieces, a testing method, a contactor and a method of manufacturing the contactor, will now be described on the basis of the embodiment shown in FIGS. 1 to 5B. In this embodiment, a reliability test is applied to a plurality of IC chips formed on a wafer.

Figure 3:
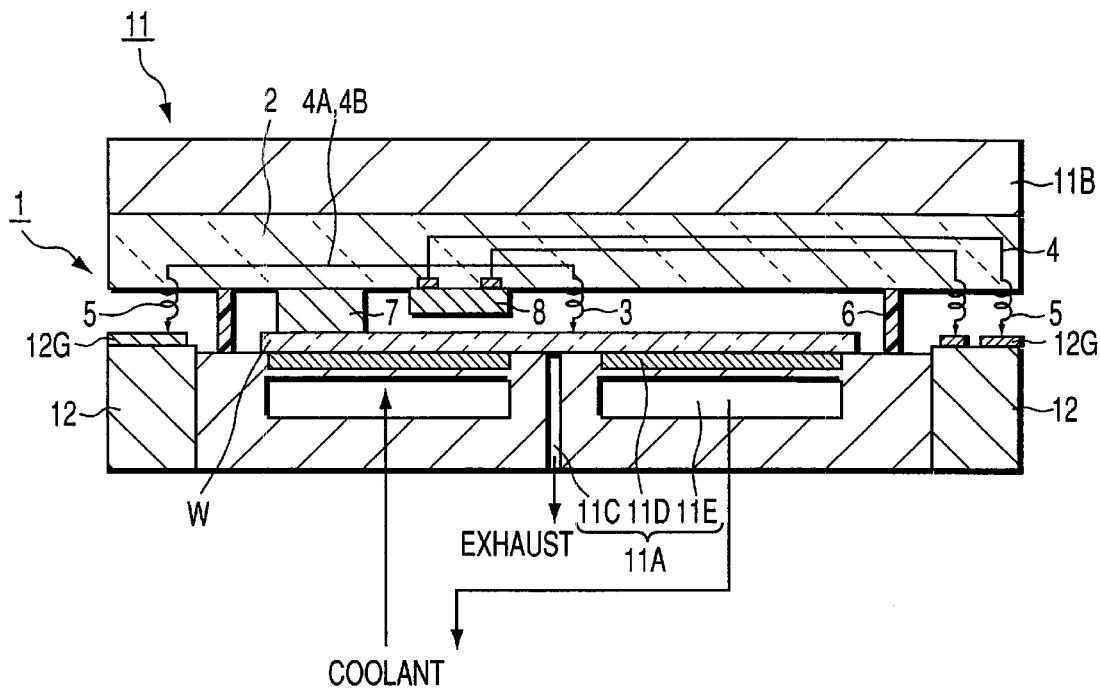
FIG. 3 is a cross sectional view showing mainly the relationship between the contactor and the test piece of the collective testing apparatus of the test piece shown in FIG. 1.

As shown in FIG. 3, the collective testing apparatus of a test piece, i.e., a wafer collective testing apparatus, in this embodiment comprises a wafer housing body 11 having a wafer W used as a test piece housed therein and also having a contactor 1, which is collectively brought into contact with the wafer, arranged therein and an electric connector 12 that can be electrically connected selectively to the contactor 1 arranged within the wafer housing body 11. The contactor 1 is connected to a tester (see FIG. 1) through the electric connector 12. A plurality of IC chips used as a test piece is classified into several groups each consisting of, for example, 16 IC chips or 32 IC chips for the testing. These groups are successively switched by a switching means of a multiplexer, etc. so as to be connected to the tester and, thus, the reliability of all the IC chips formed on the wafer is tested.

As shown in FIG. 3, the wafer housing body 11 comprises a circular chuck 11A for holding the wafer W, the contactor 1 arranged to face the chuck 11A, and a holder 11B for holding the contactor 1. Both the wafer W and the contactor 1 that is collectively brought into contact with the wafer W are housed in the wafer housing body 11. It is desirable to arrange the electric connector 12 to surround the outer circumferential surface of the chuck 11A.

As shown in FIG. 3, a vacuum exhaust passageway 11C open on the surface at a plurality of points is formed in the chuck 11A and connected to a vacuum exhaust device (not shown) so as to permit the wafer W disposed on the surface of the chuck 11A to be held on the chuck 11A by vacuum suction. A temperature control mechanism consisting of a heater 11D and a coolant passageway 11E is arranged within the chuck 11A. The wafer W is heated by the heater 11D and cooled by a cooling medium, e.g., ethylene glycol, circulated within the coolant passageway 11E so as to maintain the wafer W at a predetermined temperature. It is possible to arrange a similar temperature control mechanism within the holder 11B so as to maintain the wafer W at a predetermined temperature in cooperation with the chuck 11A.

As shown in FIGS. 3 and 4, the contactor 1 comprises a contactor substrate 2, e.g., a silicon substrate, having a diameter larger than that of the wafer W, a plurality of probe terminals 3 arranged on the surface of the silicon substrate 2 in a manner to correspond to the testing electrode pads for all the IC chips formed on the wafer W or to the testing electrode pads for some of the IC chips formed on the wafer W, and connection terminals 5 connected to the probe terminals 3 via a first electric connecting wiring 4A. As shown in FIG. 4, the probe terminals 3 are arranged to form a matrix within a wafer-corresponding region 1A of the silicon substrate 2, and the connection terminals 5 are arranged to form a ring within an outer peripheral region 1B outside the wafer-corresponding region 1A. A ring-like sealing member 6 is arranged between the probe terminal 3 and the connection terminal 5 of the silicon substrate 2. As shown in FIG. 3, the sealing member 6 is in contact with the surface of the chuck 11A during the test so as to shield the free space between the contactor 1 and the wafer W from the outside. A plurality of heat transmitting media 7, e.g., an electrically insulated copper or aluminum, are fixed inside the sealing member 6 at positions where these heat transmitting media 7 do not interfere with the probe terminal 3 and with the first electric connecting wire 4A. The heat transmitting medium 7 serves to release the heat generated from the wafer W toward the silicon substrate 2 and to suppress an excessive upward movement of the wafer W toward the contactor 1 so as to prevent the probe terminal 3 from receiving an excessive load. At least one temperature sensor 8 is fixed between adjacent heat transmitting media 7 such that the temperature sensor 8 does not interfere with the probe terminal 3 and with the first electric connecting wiring 4A. The temperature of the wafer W under test is detected by the temperature sensor 8, and the temperature of the chuck 11A is controlled on the basis of the temperature detected by the temperature sensor 8.

The probe terminal 3 comprises an input pin for inputting a pattern signal for the testing to the wafer W and an outputting pin for outputting a pattern signal denoting the test result from the wafer W. The test result information generated from the outputting pin is outputted to the tester side via a second electrical connecting wire 4B. The connection terminal 5 comprises a pin that is electrically connected to an electrode pattern 12G of the electric connector 12 for receiving a control signal generated from the tester and another pin in contact with the electrode pattern 12G of the electric connector 12 for transmitting a temperature measuring signal generated from the temperature sensor 8 to the tester side.

FIG. 5A shows the construction of the probe terminal 3 mounted to the contactor substrate 2 (silicon substrate). As shown in the drawing, the first electrical connecting wire 4A consisting of, for example, aluminum or copper is formed on the surface of the silicon substrate 2. A via hole 9, i.e., a terminal hole, for receiving a terminal is formed in an edge portion of the first electrical connecting wire 4A. The first electrical connecting wire 4A can be formed on the surface of the silicon substrate 2. Alternatively, the wire 4A consisting of a single layer or a plurality of layers can be formed within the silicon substrate 2. The impedance of the first electrical connecting wire 4A of the contactor 1 is aligned with the impedance of the IC chip to allow the pattern signal for the testing and the information on the test result to be transmitted efficiently without attenuation or reflection.

A conductive film 40 can be formed on the inner circumferential surface of the via hole 9 by a metal equal to that of the first electrical connecting wire 4A such that the conductive film 40 is connected to the first electrical connecting wire 4A. The probe terminal 3 is inserted into the via hole 9 within the wafer region 1A, and the connection terminal 5 is inserted into the via hole 9 within the outer circumferential region 1B. The via hole 9 can be formed in the shape of, for example, a circular hole having a depth of scores of $\mu$m and a diameter of several $\mu$m. In this case, the probe terminal 3 or the connection terminal 5 can be projected by scores of $\mu$m from the surface of the silicon substrate 2.

Since the probe terminal 3 and the connection terminal 5 inserted into the via holes 9 can be made equal to each other in construction, an example of inserting the probe terminal 3 into the via hole 9 will now be described with reference to FIGS. 5A and 5B. As shown in FIGS. 5A and 5B, the probe terminal 3 can be in the shape of a pillar having a substantially square cross section and including a truncated pyramidal proximal end portion 3A. The probe terminal 3 can also shaped to include a downwardly tapered trapezoid distal end portion 3B. The probe terminal 3 can be formed of a conductive metal such as tungsten, beryllium copper. It is possible to form a corner portion 3D on the side of the proximal end portion of the probe terminal 3 in a size larger than the via hole 9. Under the state that the proximal end portion of the probe terminal 3 is pressed into the via hole 9, the corner portion 3D is electrically connected to the conductive film 40 formed on the inner circumferential surface of the via hole 9. It is desirable to form grooves 3C alternately on the mutually facing surfaces of the probe terminal 3 on the side of the distal end portion. It is also desirable for the groove 3C to extend beyond the axis of the probe terminal 3. If a load is applied to the probe terminal 3 by the contact pressure with the wafer W, the probe terminal 3 is elastically deformed in the axial direction of the probe terminal 3 such that the width of the groove 3C is decreased. By this elastic deformation, the probe terminal 3 is electrically connected to the electrode pad for the testing without fail. On the other hand, if the probe terminal 3 is moved away from the wafer W, the distal end portion of the probe terminal 3 is brought back to the original state.

The contactor 1 constitutes the wafer housing body 11 together with the chuck 11A. As shown in, for example, FIG. 1, the wafer housing body 11 comprises a clock circuit 1A capable of varying the frequency and a test pattern signal generating circuit 1B for generating a test pattern signal corresponding to the frequency of the clock circuit 1A and an expected value pattern signal. These clock circuit 1A and test pattern signal generating circuit 1B, which can be mounted to the silicon substrate 2 of the contactor 1 or to the holder 11B, can also be mounted to the electrical connector 12. Alternatively, these can be mounted separately to any of the contactor 1, the holder 11B and the electrical connector 12. In the embodiment shown in the drawings, the clock circuit 1A and the test pattern signal generating circuit 1B are mounted to the contactor 1. The test pattern signal generating circuit 1B generates a test pattern signal on the basis of a control signal S supplied from the tester to the circuit 1B through the electrical connector 12. The test pattern signal is transmitted to each of the IC chips via a buffer 1C and the probe terminal 3. The contactor 1 is connected to the probe terminal 3 via a buffer 1D. The contactor 1 comprises a register 1E for temporarily storing the test result information outputted from the IC chip through the probe terminal 3 and a comparator circuit 1F for comparing the test result information transferred from the register 1E with an expected value pattern signal to determine whether the IC chip is good or not, the result of determination being transmitted to the tester side. Any of the clock circuit 1A, the test pattern signal generating circuit 1B, the buffers 1C, 1D, the register 1E and the comparator circuit 1F can be formed within the silicon substrate 2 or on the silicon substrate 2.

The test pattern signal generating circuit 1B generates a test pattern signal and, then, an expected value pattern signal based on a control signal supplied from the tester. The expected value pattern signal thus generated is outputted to the comparator circuit 1F. The register 1E successively transfers the test result information to the comparator circuit 1F based on a reference clock signal generated from the tester. The number of comparator circuits 1F should desirably be at least equal to the number of IC chips that are tested in a single operation. For example, where 16 or 32 IC chips are tested in a single operation, the number of comparator circuits 1F should desirably be at least 16 or 32. Of course, it is possible for the number of comparator circuits 1F to be equal to the number of all the IC chips formed on the wafer.

Where the test pattern signal generating circuit 1B is mounted to the contactor 1, the wiring between the circuit 1B and the probe terminal 3 can be markedly shortened, compared with the case where the circuit 1B is mounted to the tester. The shortening of the wiring makes it possible to test the reliability of the IC chip under a high operating speed equal to the actual operating speed of the IC chip.

Figure 1:
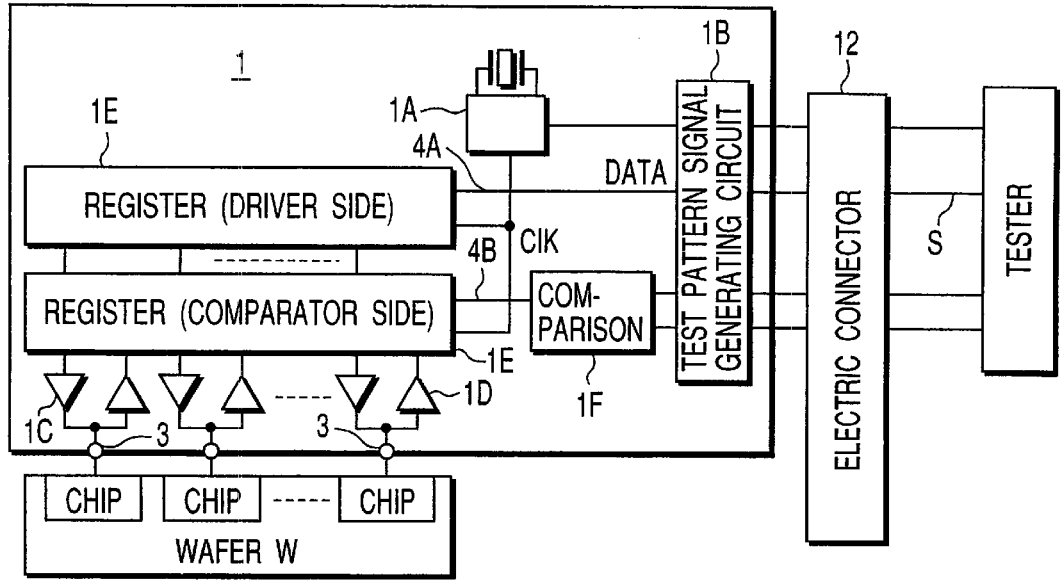
FIG. 1 is a block diagram showing a gist portion of a collective testing apparatus of a test piece according to one embodiment of the present invention.
Figure 2:
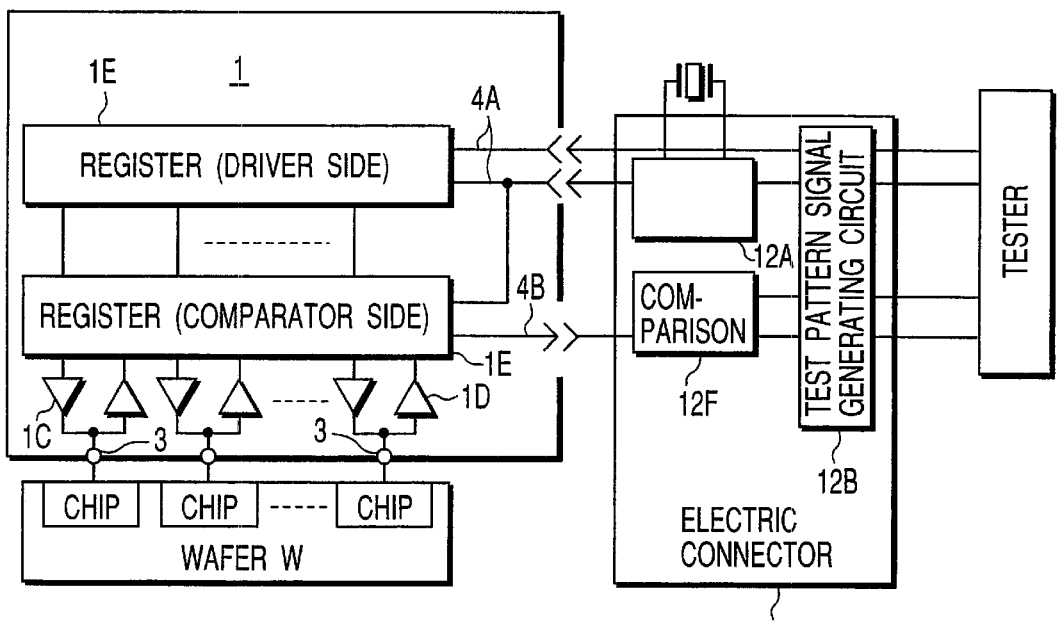
FIG. 2 is a block diagram showing a gist portion of a collective testing apparatus of a test piece according to another embodiment of the present invention.

It is also possible to mount a clock circuit 12A, a test pattern signal generating circuit 12B and a comparator circuit 12F to the electrical connector 12 as shown in, for example, FIG. 2. In this case, it is possible to obtain the function and effect similar to those of the contactor shown in FIG. 1.

The testing apparatus of the construction described above is operated as follows. Specifically, the pressure within the vacuum discharge passageway 11C is reduced to permit the wafer W disposed on the chuck 11A to be held by vacuum suction on the chuck 11A. The wafer W is cooled by the coolant circulated within the cooling medium passageway 11E. The contactor 1 held by the holder 11B is transferred onto the chuck 11. The connection terminal 5 of the contactor 1 is electrically connected to the electrode pattern 12G of the electric connector 12, and the seal member 6 is allowed to adhere to the surface of the chuck 11A on the outside of the wafer W such that all the probe terminals 3 are collectively brought into contact with the test electrode pads of the wafer W. In this case, even if there is a difference in height among the electrode pads of the wafer, the probe terminals 3 are elastically deformed depending on the height of the test electrode pads for each IC chip. As a result, the difference in height is absorbed so as to bring the probe terminals into a good electric contact with the test electrode pads. Where the chuck 11A and the contactor 1 are positioned excessively close to each other, the heat transmitting medium 7 acts as a stopper to prevent the chuck 11A and the contactor 1 from being positioned excessively close to each other and, thus, the probe terminal 3 is prevented from being damaged.

On the other hand, defective chips included in all the IC chips, e.g., 32 IC chips, are determined on the basis of the result of a simple test conducted in advance. These defective chips are electrically detached from the test channel, and a control signal is successively supplied to the remaining good IC chips under the control of a multiplexer so as to test all the good chips. To be more specific, a control signal is supplied from the tester to the contactor 11, and the test pattern signal generating circuit 1B forms a test pattern signal corresponding to the frequency of the clock circuit 1A. The test pattern signal is applied to each IC chip via the buffer 1C and the probe terminal 3. The test result information generated from each IC chip is transmitted from the probe terminal 3 for output to the register 1E so as to be stored temporarily in the register 1E. The register 1E transmits the test result information to the comparator circuit 1F based on a reference clock signal supplied from the tester. The test pattern signal generating circuit 1B forms an expected value pattern signal based on the control signal supplied from the tester. The expected value pattern signal is transmitted to the comparator circuit 1F. The comparator circuit 1F compares the test result information (test result pattern signal) with the expected value pattern signal so as to determine whether each IC chip is good or not and, then, transmits the result of the determination to the tester via the electrical connector 12. In this step, the wafer W is kept maintained at a predetermined test temperature by the temperature control mechanism of the chuck 11A and the holder 11B. Specifically, the temperature control mechanism serves to keep the wafer W at a predetermined test temperature based on the test temperature of the wafer W measured by the temperature sensor 8. Also, it is possible to select the test speed by changing stepwise the frequency of the clock.

Figure 6:
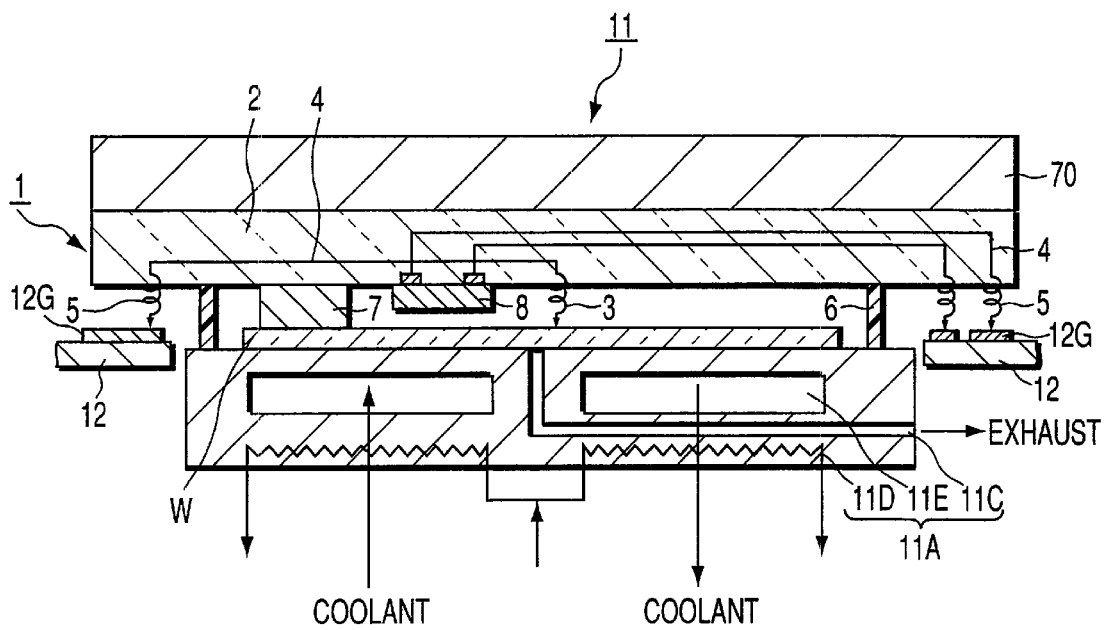
FIG. 6 is a cross sectional view showing a contactor according to another embodiment of the present invention, the contactor being in contact with a wafer.

FIG. 6 shows a wafer collective testing apparatus according to another embodiment of the present invention. The embodiment shown in FIG. 6 differs from the embodiment shown in FIG. 3 in the electric connector 12, the position of a heater 11D, the temperature sensor 8 and a pushing body 70, and is equal to the embodiment of FIG. 3 in the other constructions. The electric connector 12, the position of the heater 11D, the temperature sensor 8 and the pushing body 70 will now be described with reference to FIG. 6.

As shown in FIG. 6, the electric connector 12 is mounted apart from the chuck 11A. The heater 11D is arranged below the coolant passageway 11E. The pushing body 70 pushes the contactor 1 from above the chuck 11A to bring the connection terminal 5 into contact with the electrode pattern 12G of the electric connector 12 so as to achieve an electric connection between the two. It is possible to arrange within the pushing body 70 a cooling jacket for cooling the contactor 1 and the wafer W during the test. The temperature sensor 8 is high enough to contact the surface of the wafer W. A large number of very small projections like, for example, a thermal via, can be arranged for forming the heat transmitting medium 7.

Figure 7:
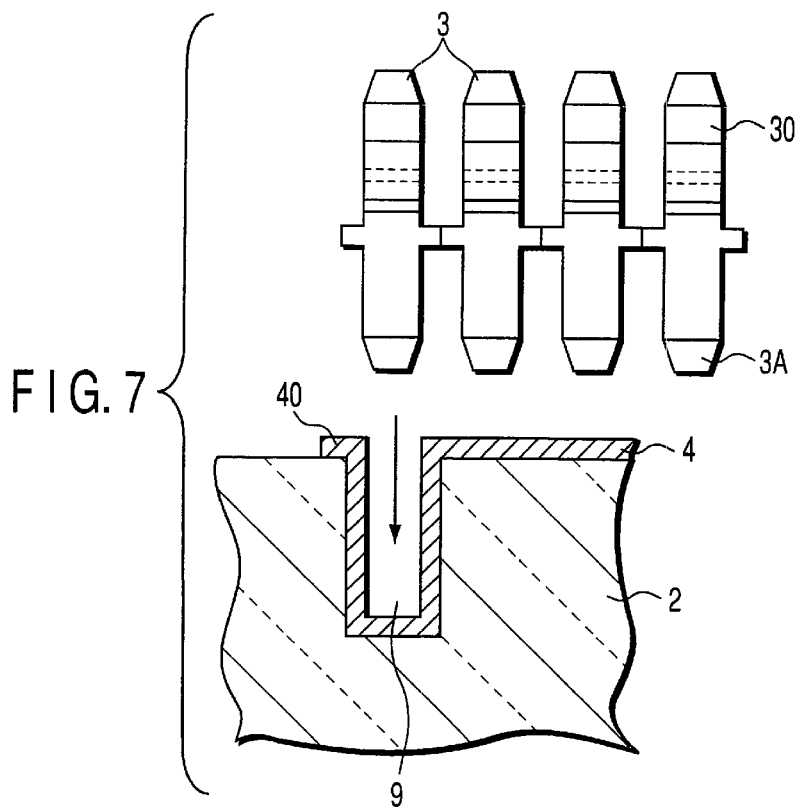
FIG. 7 shows how the probe terminals are mounted to a silicon substrate (contactor substrate) in a process of manufacturing a contactor.

A process technology and a micro machine technology can be employed for manufacturing the contactor 1. For example, the via hole 9 can be formed in an edge portion of each wiring pattern 4 by forming wiring patterns 4 several times by CVD, followed by an etching process. The conductive film 40 is formed by CVD on the inner circumferential surface of each via hole 9. In order to fit the probe terminal into the via hole 9, it is desirable to use a probe terminal member 30 having a plurality of probe terminals 3 joined to each other as shown in FIG. 7. The probe terminal member 30 can be prepared by using a micro machine or the like. For fitting the probe terminal 3 into the via hole 9 of the silicon substrate 2, the probe terminals 3 are detached one by one from the probe terminal member 30, and the detached probe terminal 3 is pressed into the via hole 9 by using, for example, a micro hand. It should be noted that a downwardly tapered trapezoid portion 3A is formed in the proximal end portion of the probe terminal 3. Since the trapezoid portion 3A is smoothly guided into the via hole 9, it is possible to overcome a slight positional deviation between the probe terminal 3 and the via hole 9.

In this embodiment, the clock circuit 1A and the test pattern signal generating circuit 1B can be mounted together or separately from each other in any of the contactor 1, the electric connector 12 and the pushing body 70.

Figure 8:
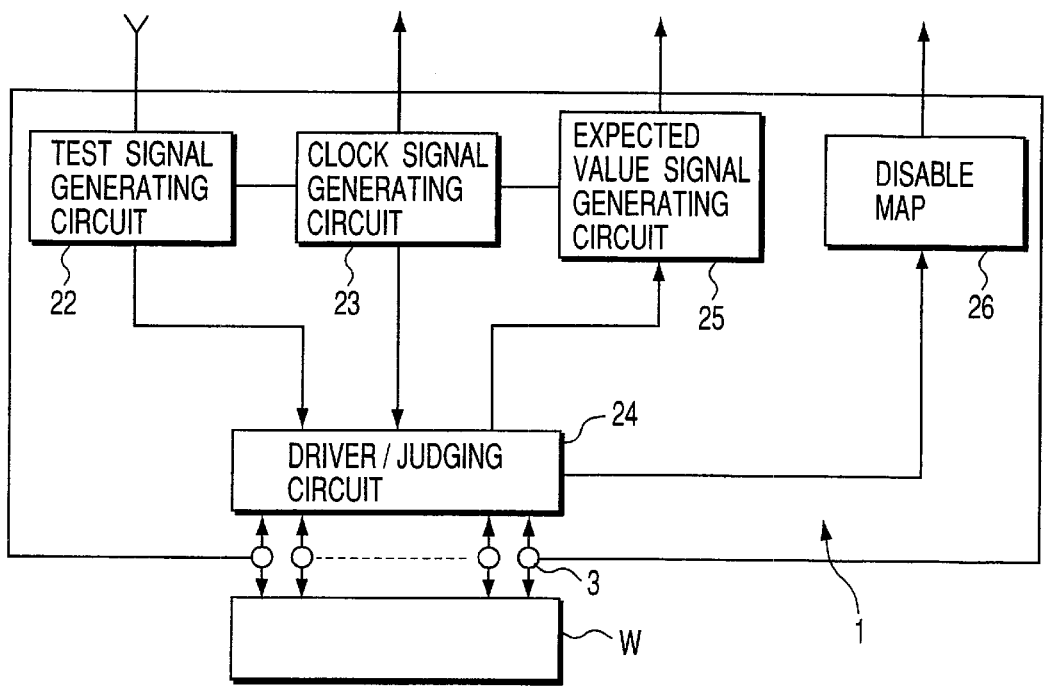
FIG. 8 is a block diagram showing the construction of the contactor shown in FIG. 6.

As shown in FIG. 8, the contactor 1 in this embodiment comprises a test pattern signal generating circuit 22, a clock signal generating circuit 23, a driver/judging circuit 24, an expected value signal generating circuit 25 and a disable map 26. Therefore, the contactor 1 itself is capable of judging whether the IC chip is good or not. To be more specific, the contactor 1 is collectively brought into contact with the wafer W to permit each IC chip of the wafer W to be electrically connected to the tester. Under this condition, the test pattern signal generating circuit 22 and the clock signal generating circuit 23 of the contactor 1 generate a predetermined test signal and a clock signal, respectively, in accordance with a predetermined program. In response to the clock signal, the driver/judging circuit 24 is operated to transmit the test pattern signal to a predetermined IC chip formed on the wafer W through the probe terminal 3. The test result information generated from each IC chip is transmitted to the driver/judging circuit 24 through the probe terminal 3. The electrical characteristics of each IC chip are inspected in the driver/judging circuit 24 by comparing the test result information with the expected value signal to judge whether the IC chip is good or not, and the judgment signal is transmitted to the tester. The driver/judging circuit 24 comprises an input/output switching circuit such as a tristate or an MOS-SW. The IC chip through which flows current exceeding a predetermined current value is judged as a poor IC chip and is detached from the power source. As a result, the other IC chips are not electrically affected. The information on the IC chip detached from the power source is stored in the disable map 26.

As described above, a process technology is employed in the present invention in conformity with the arrangement of the test electrode pads of the test piece so as to form the via hole 9 for engagement of the probe terminal 3. Further, since it is possible to form the contactor by automatically inserting the probe terminal 3 into the via hole 9 by using, for example, a micro machine, the probe terminals 3 can be arranged in a short pitch. Also, since the grooves 3C of the probe terminal 3 permit the probe terminal 3 to be deformed in the axial direction when the probe terminal 3 is compressed, the difference in height among the test electrode pads derived from, for example, the warping of the test piece can be absorbed. Therefore, good contact characteristics can be obtained, making it possible to perform the test with a high accuracy.

It should also be noted that, since the temperature sensor 8 is mounted to the contactor in this embodiment, the test temperature can be measured directly and accurately. Also, the heat of the test piece W can be released promptly through the heat transmitting medium 7 of the contactor 1 so as to prevent the temperature of the test piece W from being elevated excessively. The heat transmitting medium 7 also serves to prevent the temperature of the chuck 11A from being elevated excessively so as to prevent the probe terminal 3 from being thermally damaged.

The present invention is not limited to the embodiments described above. For example, the contactor 1, which can be made detachable from the wafer housing body 11, can be formed integral with the wafer housing body 11. Also, the silicon substrate 2 is used as a substrate of the contactor in each of the embodiments described above. However, another substrate such as a ceramic substrate or a polyimide substrate can also be used in place of the silicon substrate 2. It is also possible to use a substrate having not only a wiring layer but also an active element incorporated therein.

The probe terminal 3 of any construction can be employed in the present invention as far as the probe terminal 3 can be compressed in the axial direction. For example, it is possible for the side surface of the probe terminal 3 to be waved.

Further, the probe terminals 3 of the contactor 1 can be mounted to correspond to all the test electrode pads of the test piece W or to some of the test electrode pads.

In the present invention, the contactor 1 comprises the clock circuit 1A capable of varying the frequency and the test pattern signal generating circuit 1B for generating a test pattern signal for the test piece in conformity with the frequency of the clock circuit 1A, making it possible to shorten markedly the length of the wiring between the test pattern signal generating circuit 1B and the probe terminal 3. As a result, the electric characteristics of the test piece operating at the actual operating speed can be tested without fail while eliminating the influences given by the wiring.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A contactor, comprising:

a contactor substrate including a plurality of terminal holes, a conductive layer formed on the inner circumferential surface of each terminal hole, and a wiring layer electrically connected to said conductive layer; and a probe terminal having a proximal end portion inserted into a predetermined one of said terminal holes and electrically connected to said conductive layer, wherein grooves extending in at least two opposite directions are formed alternately on side surfaces of a distal end portion, which is exposed to the outside of said terminal hole, of said probe terminal.

2. A contactor comprising:

a contactor substrate including a plurality of terminal holes, a conductive layer formed on the inner circumferential surface of each terminal hole, and a wiring layer electrically connected to said conductive layer; and a probe terminal having a proximal end portion inserted into a predetermined one of said terminal holes and electrically connected to said conductive layer; and a holder for holding said contactor substrate, wherein grooves extending in at least two opposite directions are formed alternately on side surfaces of a distal end portion, which is exposed to the outside of said terminal hole, of said probe terminal.

* * * * *